United States Patent
Liu

(10) Patent No.: US 12,087,581 B2
(45) Date of Patent: Sep. 10, 2024

(54) ACTIVE REGION, ACTIVE REGION ARRAY AND FORMATION METHOD THEREOF

(71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 418 days.

(21) Appl. No.: 17/604,080

(22) PCT Filed: Mar. 10, 2021

(86) PCT No.: PCT/CN2021/079873
§ 371 (c)(1),
(2) Date: Oct. 15, 2021

(87) PCT Pub. No.: WO2021/208642
PCT Pub. Date: Oct. 21, 2021

(65) Prior Publication Data
US 2022/0310615 A1    Sep. 29, 2022

(30) Foreign Application Priority Data

Apr. 17, 2020    (CN) .......................... 202010303689.0

(51) Int. Cl.
*H01L 21/033*    (2006.01)
*H01L 29/08*    (2006.01)
*H10B 12/00*    (2023.01)

(52) U.S. Cl.
CPC ...... *H01L 21/0334* (2013.01); *H01L 21/0337* (2013.01); *H01L 29/0843* (2013.01); *H10B 12/30* (2023.02)

(58) Field of Classification Search
CPC ...... H10B 12/30; H10B 12/31; H10B 12/315; H10B 12/48; H10B 12/03; H10B 12/0335;
(Continued)

(56) References Cited

U.S. PATENT DOCUMENTS

| 4,651,183 A | 3/1987 | Ange |
| 5,194,752 A | 3/1993 | Kumagai |

(Continued)

FOREIGN PATENT DOCUMENTS

| CN | 101063808 B | 6/2010 |
| CN | 106504990 A | 3/2017 |

(Continued)

OTHER PUBLICATIONS

ISR for International Application PCTCN2021079873 filed mailed Jun. 7, 2021.
(Continued)

*Primary Examiner* — Ratisha Mehta
*Assistant Examiner* — Brad A Knudson
(74) *Attorney, Agent, or Firm* — Syncoda LLC; Feng Ma

(57) ABSTRACT

Disclosed are an active region, an active region array and a formation method thereof. The active region is formed in a substrate. The active region is provided with a wordline structure. The wordline structure penetrates the active region in a first direction and divides the active region into a source region and a drain region. The source region and the drain region are arranged in a second direction, and a size of the drain region in a third direction is greater than that of the source region in the third direction. An angle between the first direction and the second direction is an acute angle, and the third direction is perpendicular to the second direction.

11 Claims, 8 Drawing Sheets

(58) Field of Classification Search
CPC .............. H10B 12/377; H01L 21/0337; H01L 29/0843; H01L 21/0334
See application file for complete search history.

(56) References Cited

U.S. PATENT DOCUMENTS

| | | | |
|---|---|---|---|
| 5,305,252 A | 4/1994 | Saeki | |
| 6,197,639 B1 | 3/2001 | Lee | |
| 6,563,155 B2 | 5/2003 | Miyai et al. | |
| 6,621,119 B1 | 9/2003 | Wu | |
| 6,653,690 B1 | 11/2003 | Kasai | |
| 8,399,916 B2* | 3/2013 | Kadoya | H10B 12/315 257/296 |
| 2004/0119167 A1 | 6/2004 | Suk | |
| 2006/0270102 A1 | 11/2006 | Chang | |
| 2016/0027896 A1* | 1/2016 | Lee | H01L 21/76879 438/653 |
| 2016/0056159 A1* | 2/2016 | Kim | H10B 12/315 257/532 |
| 2016/0293478 A1* | 10/2016 | Yuan | H01L 21/76877 |
| 2018/0158827 A1* | 6/2018 | You | H10B 12/34 |
| 2018/0166449 A1* | 6/2018 | Pak | H10N 97/00 |
| 2019/0109205 A1* | 4/2019 | Yatsuda | H01L 29/66795 |

FOREIGN PATENT DOCUMENTS

| | | | | |
|---|---|---|---|---|
| CN | 109300847 A | | 2/2019 | |
| CN | 110364485 A | | 10/2019 | |
| CN | 110534480 A | | 12/2019 | |
| CN | 110896074 A | | 3/2020 | |
| IN | 102148197 A | | 8/2011 | |
| IN | 106783855 A | | 5/2017 | |
| JP | H053303 A | | 1/1993 | |
| JP | H11274438 A | | 10/1999 | |
| JP | 2008135433 A | | 6/2008 | |
| KR | 20040037841 | * | 8/2004 | ......... G11C 11/4097 |

OTHER PUBLICATIONS

Written Opinion for International Application PCTCN2021079873 filed mailed Jun. 7, 2021.

* cited by examiner

US 12,087,581 B2

ACTIVE REGION, ACTIVE REGION ARRAY AND FORMATION METHOD THEREOF

CROSS-REFERENCE TO RELATED APPLICATIONS

This application is a national phase entry of International Patent Application No. PCT/CN2021/079873 filed on Mar. 10, 2021, which claims priority to Chinese Application No. 202010303689.0 filed on Apr. 17, 2020. The disclosure of the above-referenced patent applications are incorporated herein by reference in their entirety.

TECHNICAL FIELD

The present invention relates to an active region, an active region array and a formation method thereof.

BACKGROUND

With the continuous development of science and technology, people have increasingly higher requirements on semiconductor technologies, and an area of a semiconductor device is constantly reduced. Therefore, higher requirements are put on a semiconductor fabrication process and device performance.

A semiconductor memory is a memory with a semiconductor circuit for access. A Dynamic Random Access Memory (DRAM) is widely used in various fields due to its high storage speed and high integration.

SUMMARY

According to various embodiments, a first aspect of the present application provides an active region, formed in a substrate, the active region being provided with a wordline structure, the wordline structure penetrating the active region in a first direction and dividing the active region into a source region and a drain region, the source region and the drain region being arranged in a second direction, and a size of the drain region in a third direction being greater than that of the source region in the third direction;
wherein an angle between the first direction and the second direction is an acute angle, and the third direction is perpendicular to the second direction.

According to various embodiments, a second aspect of the present application provides an active region array, including:
a plurality of active regions as described above, the plurality of active regions being arranged in an array, the active regions in a same row sharing a wordline structure, and the active regions in a same column sharing a bitline structure; and
an isolation structure formed in the substrate and configured to isolate the adjacent active regions.

According to various embodiments, a third aspect of the present application provides an active-region-array formation method for forming the active region array as described above, the formation method including:
forming a hard mask layer on a surface of the substrate;
patterning the hard mask layer, a pattern of the hard mask layer being matched with a pattern of a to-be-formed active region array;
etching the substrate through the patterned hard mask layer to define a position of the active region array; and
forming the active region array in the substrate according to the defined position.

Details of one or more embodiments of the present application are set forth in the following accompanying drawings and descriptions. Other features and advantages of the present application become obvious with reference to the specification, the accompanying drawings and the claims.

BRIEF DESCRIPTION OF DRAWINGS

In order to more clearly illustrate the technical solutions in embodiments of the present application, the accompanying drawings used in the description of the embodiments will be briefly introduced below. It is apparent that, the accompanying drawings in the following description are only some embodiments of the present application, and other drawings can be obtained by those of ordinary skill in the art from the provided drawings without creative efforts.

Figure 1:
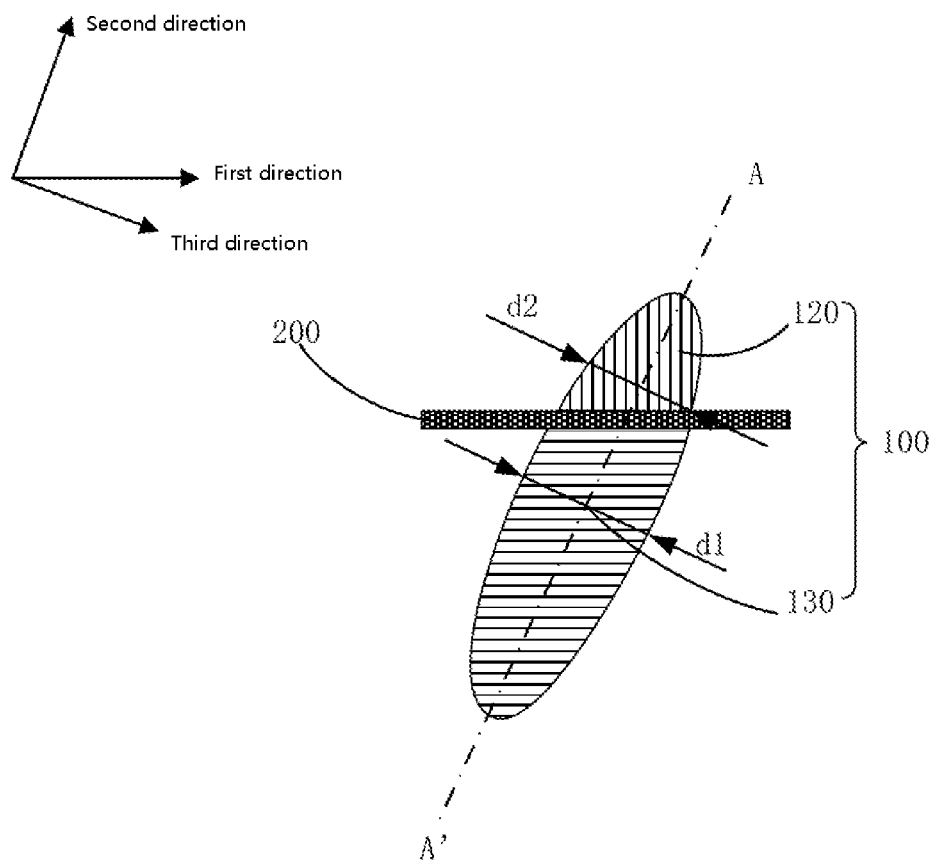
FIG. 1 is a schematic top view of an active region 100 according to an embodiment.

REFERENCE NUMERALS substrate: 10; active region: 100; wordline structure: 200; source region: 120; first side: 121; second side: 122; third side: 123; fourth side: 124; drain region: 130; symmetry axis: 140; hard mask layer: 101; mask trench: 1011; clipping mask pattern: 102; clipping subpattern: 1021; bitline structure: 300; contact hole: 310; bitline: 320; storage node contact: 400; connection pad: 500; capacitor hole: 600; isolation structure: 700; shallow trench: 701.

DESCRIPTION OF EMBODIMENTS

A DRAM includes a plurality of repeating storage units. Parasitic resistance between a bitline contact hole and a drain of a corresponding active region increases with the constant increase in an integration level of the DRAM, thereby reducing an induction margin of the DRAM and charging and discharging speeds of a storage capacitor.

To facilitate the understanding of the present invention, a more comprehensive description of the present invention will be given below with reference to the relevant accompanying drawings. Preferred embodiments of the present invention are given in the drawings. However, the present invention may be implemented in many different forms and is not limited to the embodiments described herein. Rather, these embodiments are provided to make the contents disclosed in the present invention more fully understood.

Unless defined otherwise, all technical and scientific terms used herein have the same meanings as are commonly understood by those skilled in the art. The terms used herein in the specification of the present invention are for the purpose of describing specific embodiments only but not intended to limit the present invention. The term "and/or" used herein includes any and all combinations of one or more related listed items.

In the description of the present invention, it should be understood that the orientation or position relationship indicated by the terms "upper", "lower", "vertical", "horizontal", "inner", "outer", etc. are based on the orientation or position relationship shown in the accompanying drawings and are intended to facilitate the description of the present invention and simplify the description only, rather than indicating or implying that the apparatus or element referred to must have a particular orientation or be constructed and operated in a particular orientation, and therefore are not to be interpreted as limiting the present invention.

Figure 2:
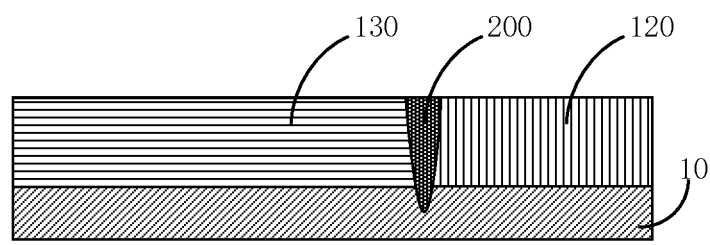
FIG. 2 is a schematic cross-sectional view of the active region 100 according to the embodiment of FIG. 1 taken along a direction AA'.

FIG. 1 is a schematic top view of an active region 100 according to an embodiment, and FIG. 2 is a schematic cross-sectional view of the active region 100 according to the embodiment of FIG. 1 taken along a direction AA'. As shown in FIG. 1 to FIG. 2, in this embodiment, the active region 100 is formed in a substrate 10. The active region 100 is provided with a wordline structure 200. The wordline structure 200 penetrates the active region 100 in a first direction and divides the active region 100 into a source region 120 and a drain region 130. The source region 120 and the drain region 130 are arranged in a second direction, and a size of the drain region 130 in a third direction is greater than that of the source region 120 in the third direction. An angle between the first direction and the second direction is an acute angle, and the third direction is perpendicular to the second direction.

In this embodiment, the active region 100 is provided with a wordline structure 200. The wordline structure 200 includes a gate dielectric layer, a wordline and a buried insulation layer formed in sequence in a wordline trench. The buried insulation layer covers the gate dielectric layer and the wordline. The wordline serves as a gate of a transistor in an integrated circuit memory and is configured to control ON and OFF of the transistor, that is, control switch-on and switch-off of a conductive channel between the source region 120 and the drain region 130. Specifically, when the transistor is turned on, the corresponding conductive channel is switched on, and a signal is transmitted from the drain region 130 to the corresponding source region 120 or transmitted from the source region 120 to the corresponding drain region 130. When the transistor is turned off, the corresponding conductive channel is switched off, and no signal is transmitted between the source region 120 and the drain region 130, so as to realize a control function of a device.

It should be noted that, the angle between the first direction and the second direction being an acute angle in this embodiment means that an angle of rotation when starting ends of a vector of the first direction and a vector of the second direction coincide and the vector of the second direction is rotated clockwise to coincide with the vector of the first direction is an acute angle. In addition, a maximum size of the drain region 130 in the third direction is defined herein as a size of the drain region 130 in the third direction because sizes of different positions of the drain region 130 in the third direction are not exactly the same. That is, the size of the drain region 130 as shown in FIG. 1 in the third direction is d1. Similarly, a maximum size of the source region 120 in the third direction is defined as a size of the source region 120 in the third direction. That is, the size of the source region 120 as shown in FIG. 1 in the third direction is d2, and d1>d2. In other embodiments, the sizes of the source region 120 and the drain region 130 in the third direction are defined the same as in this embodiment, and not described in detail.

Figure 3:
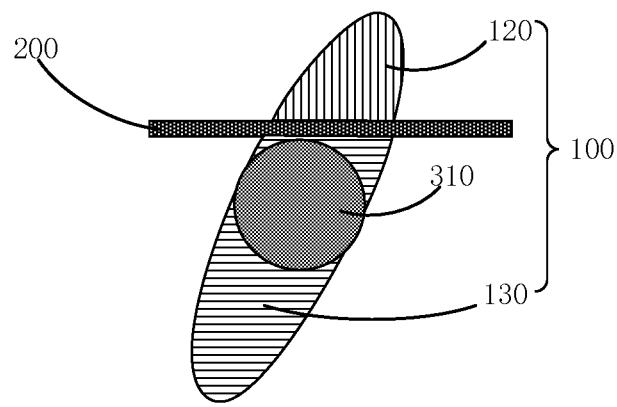
FIG. 3 is a schematic top view of a contact hole 310 arranged on a drain region 130 according to the embodiment of FIG. 1.

FIG. 3 is a schematic top view of a contact hole 310 arranged on the drain region 130 according to the embodiment of FIG. 1. As shown in FIG. 3, in this embodiment, based on the active region 100 according to the embodiment of FIG. 1, the drain region 130 according to the embodiment of FIG. 1 is provided with a contact hole 310. The size of the drain region 130 in the active region 100 is greater than that of the source region 120 in the third direction, so that the drain region 130 may be provided with the larger contact hole 310, so as to increase a contact area between the drain region 130 and the contact hole 310. According to a parasitic resistance generation principle, the increase in the contact area can reduce parasitic resistance between the drain region 130 and the contact hole 310, so as to increase an induction margin and charging and discharging speeds of the DRAM.

Further, in this embodiment, the active region 100 has an elliptic cross section. The shape of the cross section is exemplary only, but is not limited to the ellipse. In other embodiments, the shape of the cross section may also be other regular figures, or other irregular figures. Contact resistance between the contact hole 310 and the drain region 130 can be reduced only if the active region 100 satisfies a limiting condition that the size d1 of the drain region 130 in the third direction is greater than the size d2 of the source region 120 in the third direction, which thus also falls within the protection scope of the present application.

In one embodiment, the source region 120 is electrically connected to an electrode of a capacitor hole 600. The source region 120 is configured to transmit to-be-stored data to the capacitor hole 600 or transmit stored data extracted from the capacitor hole 600. The drain region 130 is electrically connected to a bitline 320 through the contact hole 310. The drain region 130 is configured to transmit the to-be-stored data acquired from the bitline 320 or transmit the extracted stored data to the bitline 320.

Specifically, when data is stored to the capacitor hole 600, the wordline controls a conductive channel of a corresponding transistor to be switched on, the bitline 320 transmits the to-be-stored data to the drain region 130 through the contact hole 310, and the to-be-stored data is transmitted to the capacitor hole 600 for storage through the switched-on conductive channel and the source region 120. When the stored data is extracted from the capacitor hole 600, the wordline controls the conductive channel of the corresponding transistor to be switched on, the stored data is transmitted to the drain region 130 through the source region 120 and the switched-on conductive channel, and the bitline 320 acquires the stored data from the drain region 130 through the contact hole 310. In this embodiment, data is quickly stored and extracted through a connection relationship between the resource region 120 and the drain region 130.

Figure 4:
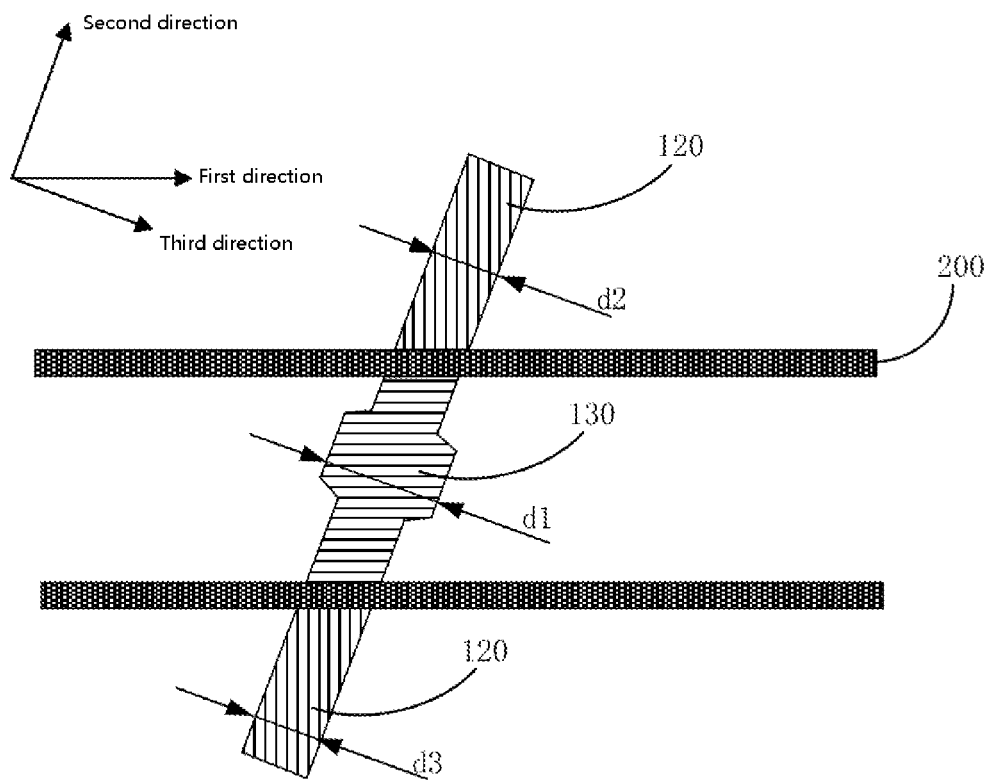
FIG. 4 is a schematic top view of an active region 100 according to another embodiment.

FIG. 4 is a schematic top view of an active region 100 according to another embodiment. As shown in FIG. 4, in this embodiment, the active region 100 is provided with two wordline structures 200 penetrating the active region 100 and dividing the active region 100 into one drain region 130 and two source regions 120. The source regions 120 and the drain region 130 are arranged in sequence in the second direction in order of the source region 120, the drain region 130, and the source region 120, and a size of the drain region 130 in the third direction is greater than that of each source region 120 in the third direction; that is, d1>d2 and d1>d3.

Specifically, the active region 100 in this embodiment has a cross section of an irregular polygon. One active region 100 is provided with two penetrating wordline structures 200, so that two source regions 120 can be formed based on one active region 100, and a structure of a storage capacitor hole 600 can be formed on each source region 120. Further, since each wordline structure 200 can control switch-on and switch-off of the conductive channel of the corresponding transistor separately, two wordline structures 200 can be used to simultaneously control one of two transistors of a same active region 100 to be switched on and the other to be switched off, so as to achieve an effect of transmitting signals to different resource regions 120 through a same contact hole 310 in a time division manner. Compared with the active region 100 in which the source region 120 is in one-to-one correspondence to the drain region 130 in the embodiment of FIG. 1, the arrangement manner of the source region 120 and the drain region 130 in this embodiment can not only reduce the parasitic resistance at the drain region 130, but also improve the integration level of the active region 100, thereby reducing the area of the device. In other embodiments, a purpose of controlling a structure of a plurality of storage capacitor holes 600 by using a drain region 130 can also be achieved in other division manners of the source region 120 and the drain region 130.

In one embodiment, as shown in FIG. 4, the two source regions 120 are of a same size in the third direction, that is, d2=d3. The size of the drain region 130 in the third direction is M times the size of the source region 120 in the third direction. M ranges from 1.01 to 1.8, which may be, for example, 1.5. In other embodiments, the two source regions 120 may also have different sizes in the second direction. In this embodiment, design difficulty and fabrication difficulty of the active region 100 can be effectively reduced by setting the sizes of the two source regions 120 in the third direction to be the same.

Further, if the value of M is large, for example, 1.7, that is, the size d1 of the drain region 130 in the third direction is 1.7 times the size d2 of the source region 120 in the third direction, contact resistance between the contact hole 310 and the drain region 130 can be better reduced, thereby improving the performance of the device, such as charging and discharging speeds. However, if a plurality of active regions 100 are required to be closely arranged to form a highly integrated active region array, a gap between the larger drain region 130 and other adjacent active regions 100 is small, which is prone to a short circuit, thereby affecting the reliability of a fabrication process. That is, the larger drain region 130 has higher requirements on the fabrication process of semiconductor devices. Therefore, when M ranges from 1.01 to 1.8, a relationship between the contact resistance and the fabrication difficulty can be balanced well, so as to improve the performance of the device while ensuring a fabrication yield of the device.

Figure 5:
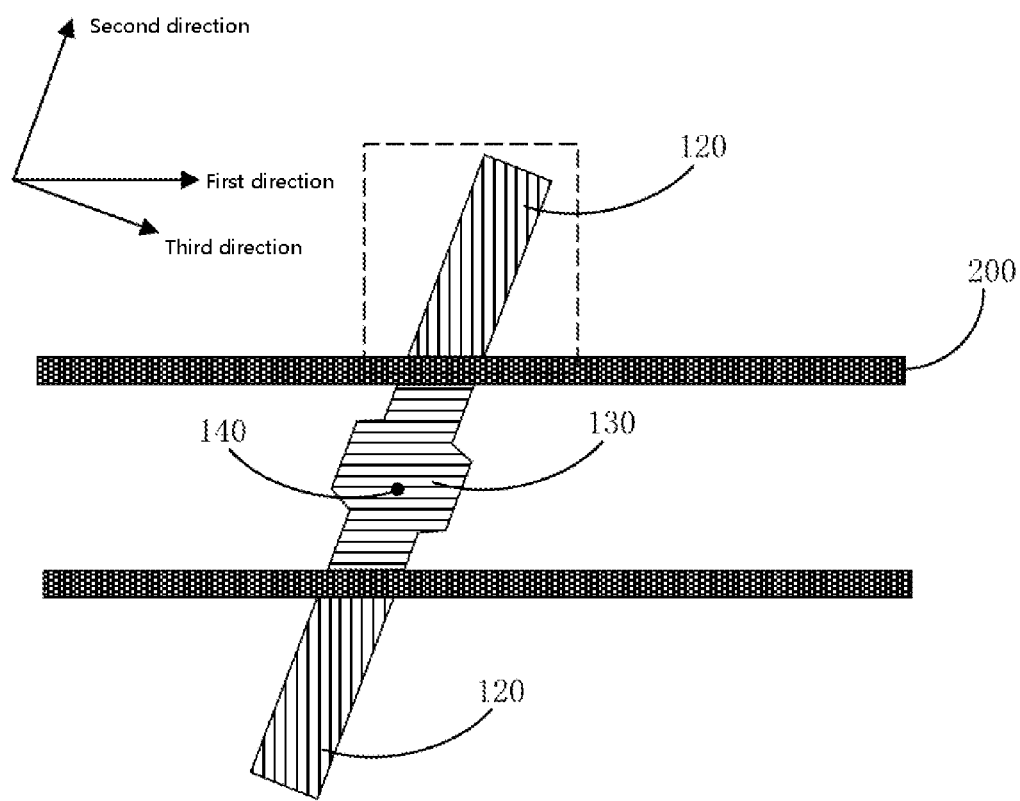
FIG. 5 is a schematic top view of an active region 100 in central symmetry according to an embodiment.

FIG. 5 is a schematic top view of an active region 100 in central symmetry according to an embodiment. As shown in FIG. 5, in this embodiment, the active region 100 has a symmetry axis 140. The active region 100 is centrally symmetric with respect to the symmetry axis 140, and an extension direction of the symmetry axis 140 is perpendicular to the substrate 10. The two source regions 120 are centrally symmetrically arranged with respect to the symmetry axis 140 of the active region 100. That is, the two source regions 120 are of a same size in the third direction, and are also of a same size in the second direction.

Figure 6:
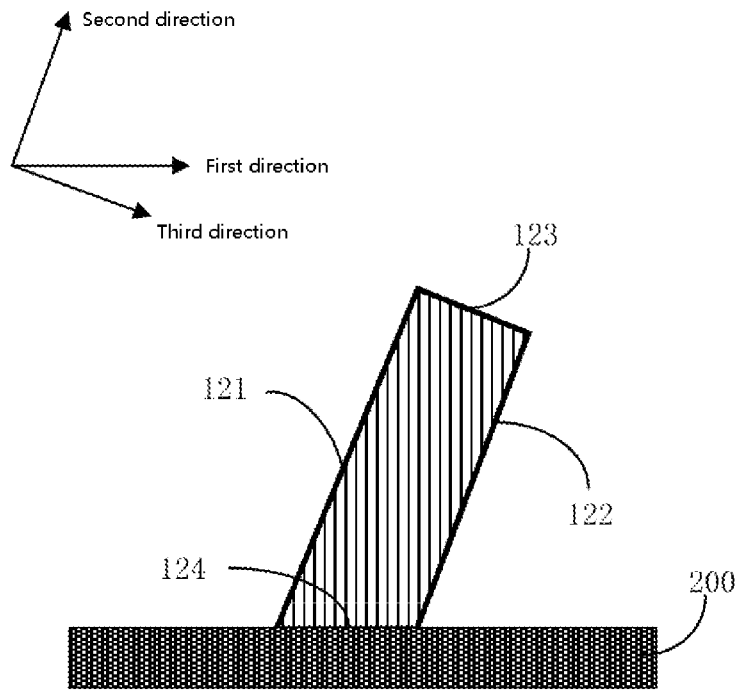
FIG. 6 is a partially enlarged view of a dotted-box portion of the active region 100 according to the embodiment of FIG. 5.

FIG. 6 is a partially enlarged view of a dotted-box portion of the active region 100 according to the embodiment of FIG. 5. As shown in FIG. 6, in this embodiment, a cross section of the source region 120 is in a shape of an irregular figure, which is defined by a first side 121, a second side 122, a third side 123 and a fourth side 124 together. Specifically, the first side 121 and the second side 122 both extend in the second direction. The third side 123 extends in the third direction and intersects the first side 121 and the second side 122. The fourth side 124 is located on a surface where the source region 120 fits with the wordline structure 200. The first side 121, the second side 122, the third side 123 and the fourth side 124 are closed together to form the shape of the cross section of the source region 120. Based on the arrangement manner of the source region 120 and the drain region 130 in this embodiment, a highly integrated memory with capacitor holes 600 uniformly distributed can be further formed through subsequent steps, so as to further reduce the area of the memory and reduce the design difficulty of the device.

Figure 7:
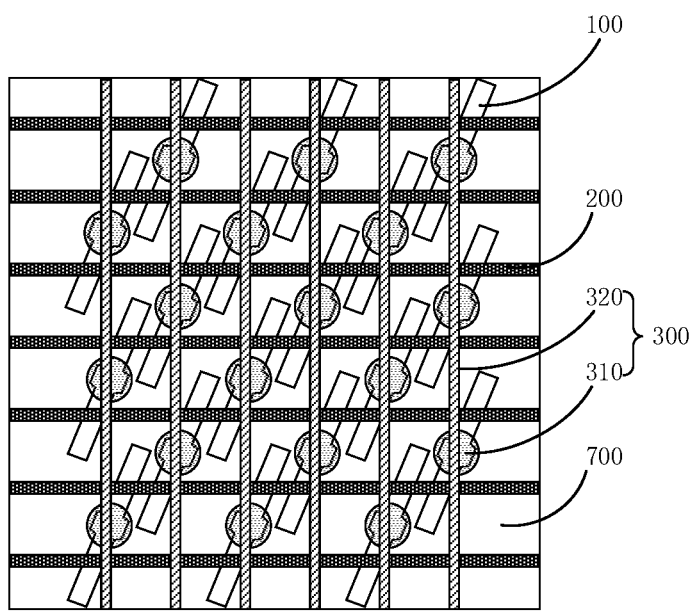
FIG. 7 is a schematic top view of an active region array according to an embodiment.

FIG. 7 is a schematic top view of an active region array according to an embodiment. As shown in FIG. 7, the active region array according to this embodiment includes: a plurality of active regions 100 as described above, the plurality of active regions 100 being arranged in an array, the active regions 100 in a same row sharing a wordline structure 200, and the active regions 100 in a same column sharing a bitline structure 300; and an isolation structure 700 formed in the substrate 10 and configured to isolate the adjacent active regions 100. In this embodiment, each active region 100 is provided with two penetrating wordline structures 200 and one penetrating bitline structure 300. An extension direction of the wordline structure 200 is perpendicular to that of the bitline structure 300. The wordline structure 200 divides the active region 100 into a source region 120, a drain region 130 and a source region 120. A projection of the bitline 310 on the substrate 10 passes through the drain region 130, and the bitline 310 is electrically connected to the drain region 130 through the contact hole 320.

Specifically, the plurality of active regions 100 being arranged in an array means that centers of the plurality of active regions 100 are arranged in an array, and array arrangement is not limited to matrix arrangement. For example, in the active region array of FIG. 7, centers of the plurality of active regions 100 form a neat and regular arrangement structure, which also falls within the protection scope of the array arrangement. In this embodiment, neat and closely arranged capacitor holes 600 can be further formed through subsequent steps based on the arrangement manner in which the active regions 100 in a same row share one wordline structure 200 and the active regions 100 in a same column share one bitline structure 300, thereby obtaining a highly integrated memory.

Optionally, the isolation structure 700 is a shallow trench isolation structure 700. The shallow groove isolation structure 700 has a small surface area, is compatible with a chemical mechanical polishing technology, can be applied to a smaller line width and a higher integration level, and thus is a better isolation technology. It should be noted that the isolation structure 700 in this embodiment is not limited to the shallow trench isolation structure 700, and other isolation structures 700 that can achieve isolation performance are also available.

Figure 8:
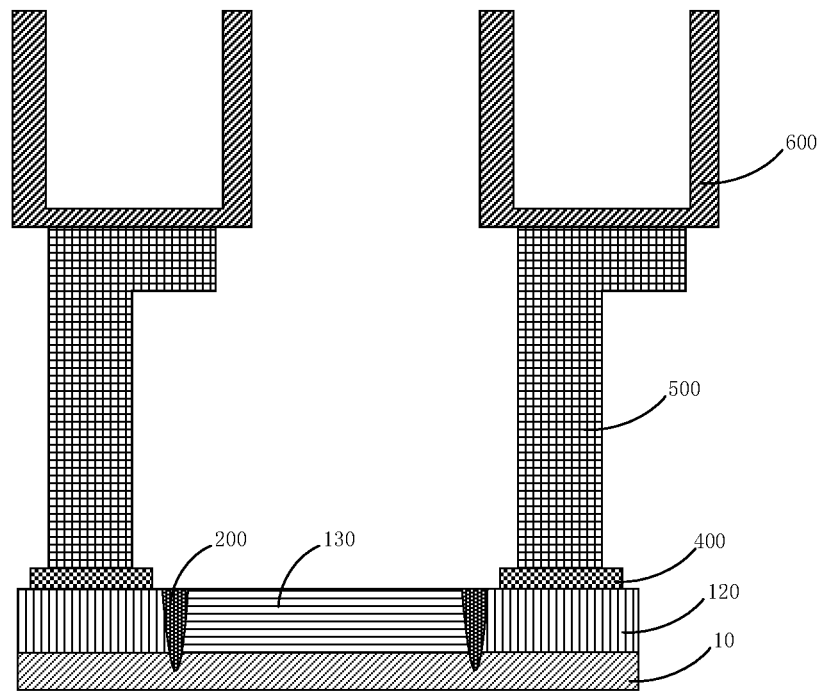
FIG. 8 is a schematic cross-sectional view of a device structure after a storage node contact 400, connection pads 500 and capacitor holes 600 are formed on the active region 100 according to an embodiment.

FIG. 8 is a schematic cross-sectional view of a device structure after a storage node contact 400, connection pads 500 and capacitor holes 600 are formed on the active region 100 according to an embodiment. As shown in FIG. 8, the storage node contact 400 is formed on a surface of the substrate 10. The storage node contact 400 is in one-to-one correspondence to and electrically connected to source regions 120 of the active region 100, and the plurality of the storage node contact 400 are isolated from one another. The storage node contact 400 may be made of doped polysilicon or metal or metal silicide, so as to improve a conductive property of the storage node contact, thereby reducing parasitic resistance of the storage node contact 400.

Further, a surface of the storage node contact 400 is provided with a connection pad 500, the storage node contact 400 is electrically connected to the connection pad 500, the storage node contact 400 and the connection pad 500 are configured to contact the source region 120 and the electrode of the capacitor hole 600, and the capacitor hole 600 is in one-to-one correspondence to the source region 120. Optionally, as shown in FIG. 8, the connection pad 500 has an inverted L-shaped cross section; that is, the connection pad 500 extends upward to a set height in a direction perpendicular to the substrate 10, with a top bent in a direction parallel to the substrate 10, so that the connection pad 500, having a smaller footprint, has a larger contact area with the electrode of the capacitor hole 600 formed in a subsequent step, thereby improving the reliability of the memory. Furthermore, tops of the connection pads 500 in a same row are bent in a same direction, and tops of the connection pads 500 in adjacent rows are bent in opposite directions.

Figure 9:
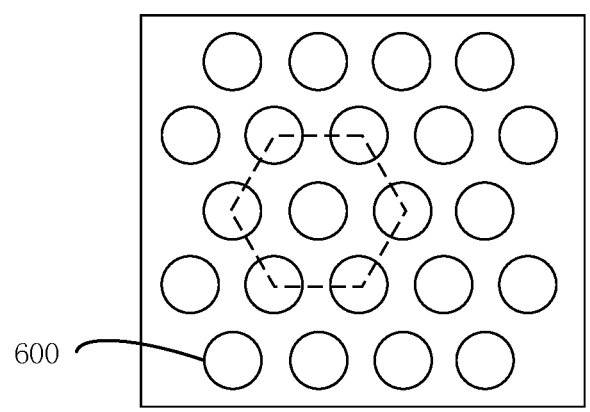
FIG. 9 is a schematic top view of the capacitor holes 600 according to an embodiment.

FIG. 9 is a schematic top view of the capacitor holes 600 according to an embodiment. As shown in FIG. 9, in this embodiment, six adjacent capacitor holes 600 are arranged in a regular hexagon in a horizontal plane, each vertical angle of the regular hexagon is provided with one capacitor hole 600, and a center of the regular hexagon is provided with one capacitor hole 600. Through the capacitor holes 600 arranged in a regular hexagon, a distance between adjacent capacitor holes 600 can be reduced in this embodiment, so that the plurality of capacitor holes 600 form close arrangement, thereby improving the integration level of the memory.

Figure 10:
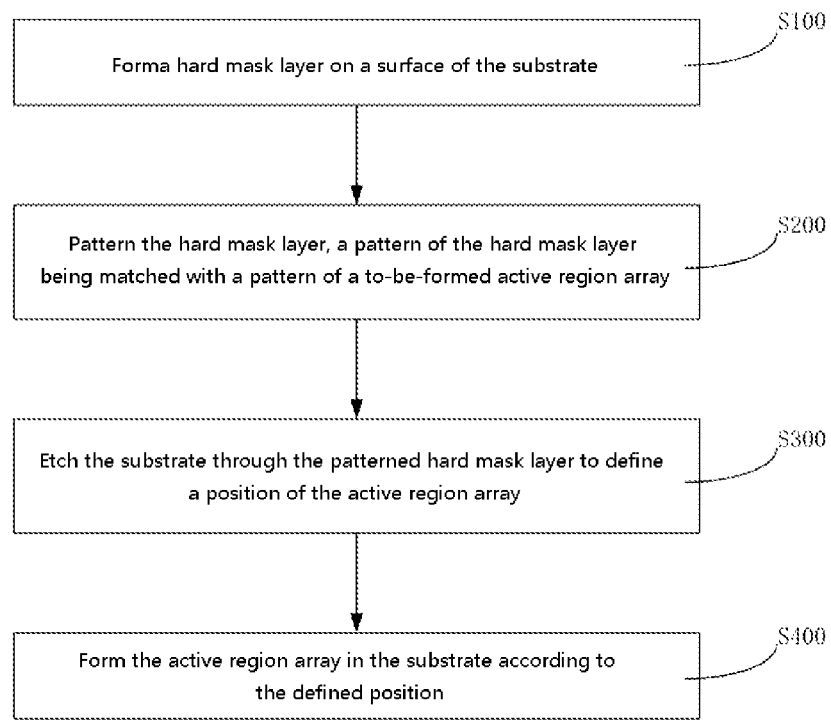
FIG. 10 is a flowchart of an active-region-array formation method according to an embodiment.

FIG. 10 is a flowchart of an active-region-array formation method according to an embodiment. This embodiment takes the formation of an active region array as shown in FIG. 7 as an example. As shown in FIG. 10, the active-region-array formation method according to this embodiment includes steps S100 to S400.

In S100, a hard mask layer 101 is formed on a surface of the substrate 10.

Specifically, the hard mask layer 101 may be made of at least one of silicon oxide, silicon nitride, silicon carbide, silicon nitride, silicon carbonitride and silicon oxycarbonitride. The hard mask layer 101 is used as a mask to etch the substrate 10.

In S200, the hard mask layer 101 is patterned, and a pattern of the hard mask layer 101 is matched with a pattern of a to-be-formed active region array.

In one embodiment, the pattern of the hard mask layer 101 is formed using a composite mask through multiple lithography processes, which specifically includes steps S210 to S230.

Figure 11:
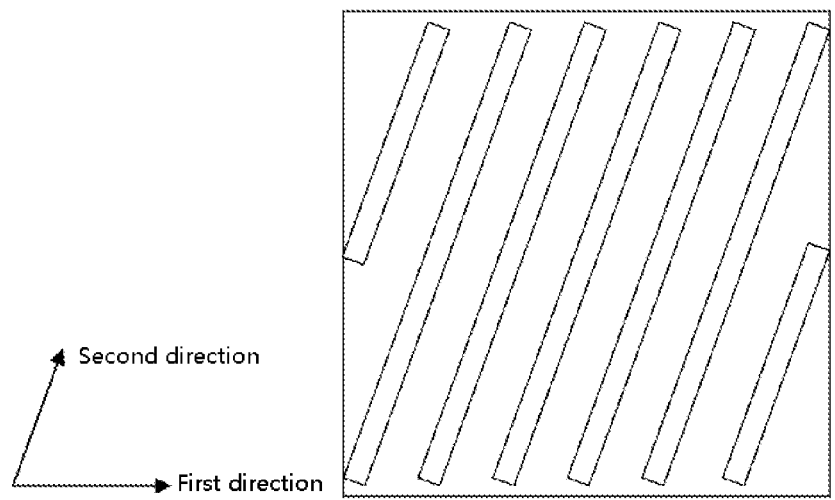
FIG. 11 is a schematic diagram of an initial active region pattern after step S210 according to an embodiment.

In S210, an initial active region pattern is formed by using a first mask. FIG. 11 is a schematic diagram of an initial active region pattern after step S210. As shown in FIG. 11, the initial active region pattern includes a plurality of strip structures extending in the second direction. The plurality of strip structures are arranged equally at a first interval in the first direction. The first mask may be a self-aligned double patterning mask or self-aligned quadruple patterning mask, so as to improve the integration level of the memory integration without changing a minimum feature size of the lithography process.

Figure 12:
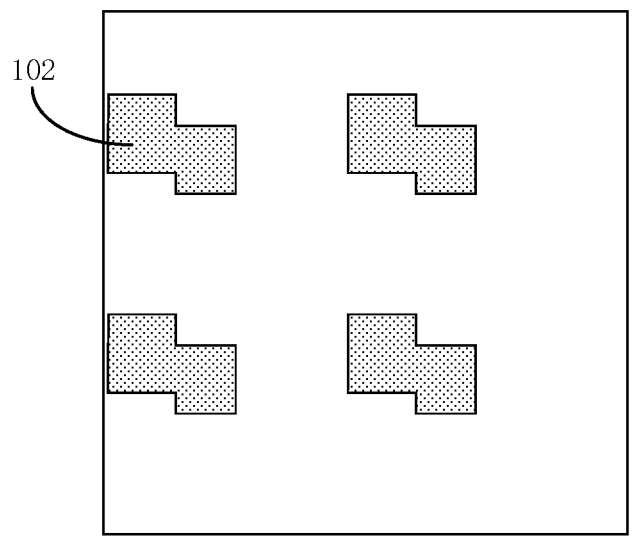
FIG. 12 is a schematic diagram of a second mask according to the embodiment of FIG. 11.

In S220, the initial active region pattern is clipped by using a second mask, so as to form a first active region pattern. FIG. 12 is a schematic diagram of the second mask according to this embodiment. As shown in FIG. 12, the second mask is provided with a plurality of clipping mask patterns 102 arranged in an array.

Figure 13:
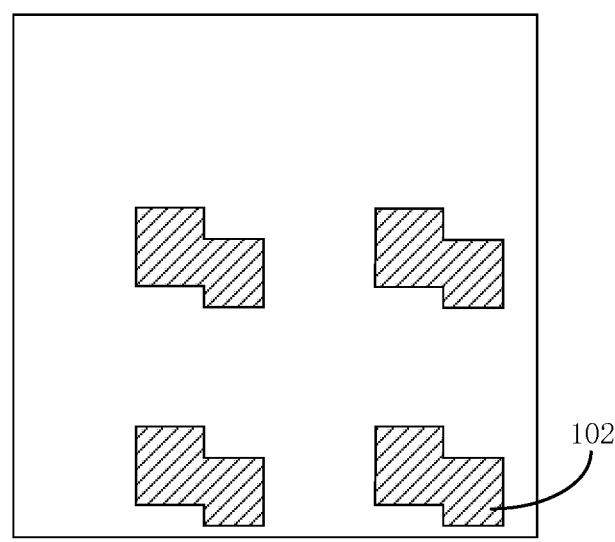
FIG. 13 is a schematic diagram of a third mask according to the embodiment of FIG. 11.

In S230, the initial active region pattern is clipped by using a third mask, so as to form a second active region pattern. FIG. 13 is a schematic diagram of the third mask according to this embodiment. As shown in FIG. 13, the third mask is provided with a plurality of clipping mask patterns 102 arranged in an array.

The clipping mask patterns 102 in the second mask and the clipping mask patterns 102 in the third mask have identical shapes and sizes, and projections of the clipping mask patterns 102 in the second mask and the clipping mask patterns 102 in the third mask on the substrate 10 do not coincide.

Figure 14:
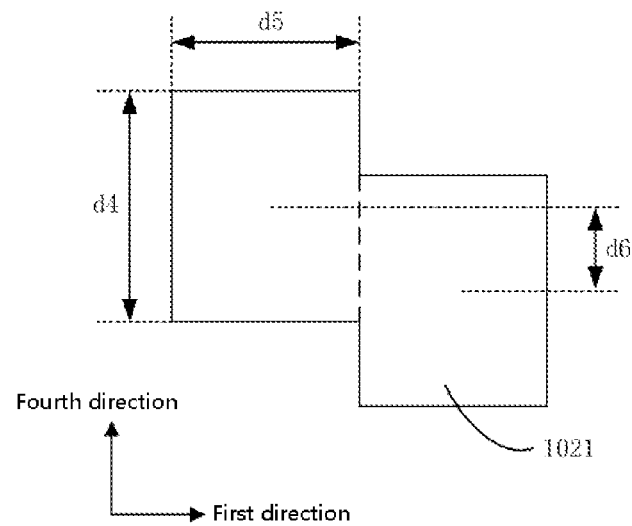
FIG. 14 is a schematic diagram of a clipping mask pattern according to the embodiment of FIG. 11.

Further, FIG. 14 is a schematic diagram of the clipping mask pattern 102 according to this embodiment. As shown in FIG. 14, in this embodiment, the clipping mask pattern 102 includes two identical clipping subpatterns 1021. The clipping subpattern 1021 is rectangular. The two clipping subpatterns 1021 fit with each other in the first direction and are staggered from each other in a fourth direction. The fourth direction is perpendicular to the first direction. Optionally, a size d4 of the clipping subpattern 1021 in the fourth direction is 1.5 times to 3 times a size d5 in the first direction, and a distance d6 between centers of the two clipping subpatterns 1021 is 0.3 times to 0.6 times d4 in the fourth direction. The clipping mask pattern 102 with the above parameters can have a better etching effect in a subsequent etching process to obtain a target active region array.

In S300, the substrate 10 is etched through the patterned hard mask layer 101 to define a position of the active region array.

Figure 15:
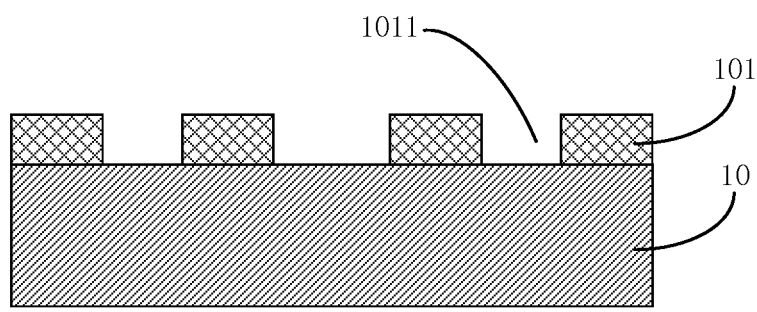
FIG. 15 is a schematic cross-sectional view of a device prior to substrate etching according to an example.

FIG. 15 is a schematic cross-sectional view of a device prior to substrate etching according to an example. As shown in FIG. 15, in this example, a patterned hard mask layer 101 is formed on a surface of the substrate 10, and the patterned hard mask layer 101 has a plurality of mask trenches 1011 with different widths.

Figure 16:
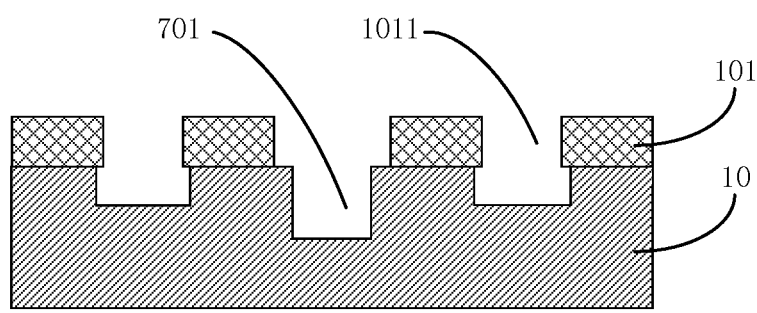
FIG. 16 is a schematic cross-sectional view of a device after substrate etching according to the example of FIG. 15.

Further, FIG. 16 is a schematic cross-sectional view of a device after substrate etching according to the example of FIG. 15. As shown in FIG. 16, due to etching characteristics of gas, a shallow trench 701 formed in the substrate 10 has a narrower width and a deeper depth after an etch through a wider region of the mask trench 1011. The shallow trench 701 formed in the substrate 10 has a wider width and a shallower depth after an etch through a narrower region of the mask trench 1011. Therefore, through the patterned hard mask layer 101, the shallow trench 701 matched with the pattern of the active region array described above can be formed in the substrate 10 by etching, so as to accurately define the position of the active region array.

In S400, the active region array is formed in the substrate 10 according to the defined position.

Specifically, the shallow trench 701 is filled with dielectric, and a surface of a wafer is flattened by chemical mechanical polishing to form the isolation structure 700. The trench can be filled with a dielectric material, such as silicon oxide, by chemical vapor deposition. After the isolation structure 700 is formed, a target active region array is formed in the substrate 10 by ion implantation.

The active-region-array formation method according to this embodiment includes: forming a hard mask layer 101 on a surface of the substrate 10; patterning the hard mask layer 101, a pattern of the hard mask layer 101 being matched with a pattern of a to-be-formed active region array; etching the substrate 10 through the patterned hard mask layer 101 to define a position of the active region array; and forming the active region array in the substrate 10 according to the defined position. In this embodiment, through the above steps, the hard mask layer 101 with a set pattern is formed, and a plurality of active regions 100 are formed in the substrate 10 to form the active region array by using etching characteristics of gas. In the active region 100 according to this embodiment, a size of the drain region 130 in the third direction is greater than that of the source region 120 in the third direction. Therefore, a contact hole 310 with a larger contact area can be formed based on the active region 100 according to this embodiment, so as to reduce contact resistance between the contact hole 310 and the drain region 130, thereby improving device performance of the memory.

It should be understood that, although the steps in the flowchart of FIG. 10 are displayed in sequence as indicated by the arrows, the steps are not necessarily performed in the order indicated by the arrows. Unless otherwise clearly specified herein, the steps are performed without any strict sequence limitation, and may be performed in other orders. In addition, at least some steps in FIG. 10 may include a plurality of substeps or a plurality of stages, and these substeps or stages are not necessarily performed at a same moment, and may be performed at different moments. The substeps or stages are not necessarily performed in sequence, and the substeps or stages and at least some of other steps or substeps or stages of other steps may be performed repeatedly or alternately.

The technical features in the above embodiments may be randomly combined. For concise description, not all possible combinations of the technical features in the above embodiments are described. However, all the combinations of the technical features are to be considered as falling within the scope described in this specification provided that they do not conflict with each other.

The above embodiments only describe several implementations of the present invention, and their description is specific and detailed, but cannot therefore be understood as a limitation on the patent scope of the present invention. It should be noted that those of ordinary skill in the art may further make variations and improvements without departing from the conception of the present invention, and these all fall within the protection scope of the present invention. Therefore, the patent protection scope of the present invention should be subject to the appended claims.

What is claimed is:

1. An active-region-array formation method, for forming an active region array, wherein the active region array comprises:
    a plurality of active regions, the plurality of active regions being arranged in an array, the active regions in a same row sharing a wordline structure, the wordline structure penetrating the active regions in the same row in a first direction and dividing each of the active regions in the same row into a source region and a drain region, the source region and the drain region being arranged in a second direction, and a size of the drain region in a third direction being greater than that of the source region in the third direction, and the active regions in a same column sharing a bitline structure; and
    an isolation structure formed in the substrate and configured to isolate the adjacent active regions;
    wherein an angle between the first direction and the second direction is an acute angle and the third direction is perpendicular to the second direction;
wherein the formation method comprises:
    forming a hard mask layer on a surface of the substrate;
    patterning the hard mask layer, a pattern of the hard mask layer being matched with a pattern of a to-be-formed active region array;
    etching the substrate through the patterned hard mask layer to define a position of the active region array; and
    forming the active region array in the substrate according to the defined position;
wherein the patterning the hard mask layer comprises:
    forming an initial active region pattern by using a first mask, wherein the first mask is a self-aligned double patterning mask or a self-aligned quadruple patterning mask;
    clipping the initial active region pattern by using a second mask, so as to form a first active region pattern, wherein the second mask is provided with a plurality of clipping mask patterns arranged in an array; and
    clipping the first active region pattern by using a third mask, so as to form a second active region pattern, wherein the third mask is provided with a plurality of clipping mask patterns arranged in an array;
    wherein the clipping mask patterns in the second mask and the clipping mask patterns in the third mask have identical shapes and sizes, projections of the clipping mask patterns in the second mask and the clipping mask patterns in the third mask on the substrate do not coincide, each of the clipping mask patterns comprises two identical clipping subpatterns each of the two clipping subpattern is rectangular the two clipping subpatterns fit with each other in the first direction and are staggered from each other in a fourth direction, and the fourth direction is perpendicular to the first direction.

2. The method according to claim 1, wherein each of the active regions is provided with two wordline structures penetrating the each of the active regions and dividing the each of the active regions into one drain region and two source regions, the source regions and the drain region are arranged in the second direction in order of the source region, the drain region, and the source region, and a size of the drain region in the third direction is greater than that of each source region in the third direction.

3. The method according to claim 2, wherein the two source regions are of a same size in the third direction, and the size of the drain region in the third direction is M times the size of the source region in the third direction, wherein M ranges from 1.01 to 1.8.

4. The method according to claim 2, wherein
the active region has a symmetry axis, the active region is centrally symmetric with respect to the symmetry axis, and an extension direction of the symmetry axis is perpendicular to the substrate; and
the two source regions are centrally symmetrically arranged with respect to the symmetry axis of the active region.

5. The method according to claim 1, further comprising:
forming a capacitor hole on the source region, wherein the source region is electrically connected to an electrode of the capacitor hole, and the source region is configured to transmit to-be-stored data to the capacitor hole or transmit stored data extracted from the capacitor hole; and
forming a contact hole on the drain region, wherein the drain region is electrically connected to a bitline through the contact hole, and the drain region is configured to transmit the to-be-stored data acquired from the bitline or transmit the extracted stored data to the bitline.

6. The method according to claim 1, further comprising:
forming a storage node contact on a surface of the substrate, wherein the storage node contact is in one-to-one correspondence to and electrically connected to the source region of the active region, and the plurality of storage node contacts are isolated from one another.

7. The method according to claim 6, further comprising:
forming a connection pad on a surface of the storage node contact, wherein the storage node contact is electrically connected to the connection pad, the storage node contact and the connection pad are configured to contact the source region and the electrode of the capacitor hole, and the capacitor hole is in one-to-one correspondence to the source region.

8. The method according to claim 7, wherein six adjacent capacitor holes are arranged in a regular hexagon in a horizontal plane, each vertical angle of the regular hexagon is provided with one capacitor hole, and a center of the regular hexagon is provided with one capacitor hole.

9. The method according to claim 7, wherein the connection pad extends upward to a set height in a direction perpendicular to the substrate, with a top portion bent in a direction parallel to the substrate, so that the connection pad, having a smaller footprint, has a larger contact area with the electrode of the capacitor hole formed in a subsequent step.

10. The method according to claim 1, wherein the isolation structure is a shallow trench isolation structure.

11. The method according to claim 1, wherein the hard mask layer is made of at least one of silicon oxide, silicon nitride, silicon carbide, silicon carbonitride and silicon oxycarbonitride.

\* \* \* \* \*